United States Patent
Lin

(10) Patent No.: US 8,070,497 B2
(45) Date of Patent: Dec. 6, 2011

(54) ELECTRICAL CONNECTOR HAVING PASSAGEWAY WITH HARD STOP PREVENTING OVER-COMPRESSION DURING DOWNWARD OPERATION

(75) Inventor: Chun-Fu Lin, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/903,222

(22) Filed: Oct. 13, 2010

(65) Prior Publication Data
US 2011/0275229 A1 Nov. 10, 2011

(30) Foreign Application Priority Data
May 6, 2010 (TW) .............................. 99208445 U

(51) Int. Cl.
*H01R 12/00* (2006.01)
(52) U.S. Cl. ........................ 439/66; 439/800; 439/724
(58) Field of Classification Search .................... 439/66, 439/700, 824
See application file for complete search history.

(56) References Cited

U.S. PATENT DOCUMENTS

| | | | |
|---|---|---|---|
| 6,506,082 B1 * | 1/2003 | Meek et al. | 439/700 |
| 7,025,602 B1 | 4/2006 | Hwang | |
| 7,381,062 B2 * | 6/2008 | Shimada | 439/66 |

* cited by examiner

*Primary Examiner* — Ross Gushi
(74) *Attorney, Agent, or Firm* — Andrew C. Cheng; Wei Te Chung; Ming Chieh Chang

(57) ABSTRACT

An electrical connector including an insulative housing and a number of terminals. The insulative housing includes an upper substrate and a lower substrate. The upper substrate defines an array of upper holes and the lower substrate defines an array of lower holes corresponding to the upper holes. The terminals are received in the upper and lower holes and each comprises an upper contact, a lower contact electrically connecting with the upper contact and a spring located between the upper contact and the lower contact. The upper contact protrudes a restricting portion for restricting the spring. A diameter of the lower hole is less than that of the upper hole and a distance of the restricting portion. So a top surface of the lower substrate supports the restricting portion.

16 Claims, 4 Drawing Sheets

ELECTRICAL CONNECTOR HAVING PASSAGEWAY WITH HARD STOP PREVENTING OVER-COMPRESSION DURING DOWNWARD OPERATION

BACKGROUNDING OF THE INVENTION

1. Field of the Invention

The present invention relates to an electrical connector for electrically connecting an electronic package with a circuit substrate, and more particularly to an electrical connector having passageways with hard stops preventing over-compression during downward operation.

2. Description of the Prior Art

A conventional electrical connector for electrically connecting an electronic package with a circuit substrate disclosed in U.S. Pat. No. 7,025,602 issued to Hwang on Apr. 11, 2006 includes an insulative housing and a number of terminals received in the insulative housing. The insulative housing includes an upper substrate and a lower substrate assembled with each other. The upper substrate defines an array of upper holes and the lower substrate defines an array of lower holes corresponding to the upper holes. The lower holes and the upper holes have same diameters. The terminals are received in the upper and lower holes and each includes an upper contact, a lower contact electrically connecting to the upper contact and a spring located between the upper contact and the lower contact. The upper contact and the lower contact move toward each other and then compress the spring when pressed by the electronic package toward the circuit substrate. If the external force is larger than the maximum elastic force of the spring, the spring deforms permanently.

In view of the above, an improved electrical connector that overcomes the above-mentioned disadvantages is desired.

SUMMARY OF THE INVENTION

Accordingly, an object of the present invention is to provide an electrical connector having passageways with hard stops preventing over-compression during downward operation.

To fulfill the above-mentioned object, an electrical connector includes an insulative housing and a plurality of terminals. The insulative housing comprises an upper substrate and a lower substrate assembled with each other. The upper substrate defines an array of upper holes and the lower substrate defines an array of lower holes corresponding to the upper holes. The terminals are received in the upper and lower holes and each comprises an upper contact, a lower contact electrically connecting with the upper contact and a spring arranged between the upper contact and the lower contact. The upper contact has a restricting portion to restrict the spring. A dimension of the restricting portion is less than a width of the upper hole while is larger than that of the lower hole. The present invention also provides an electrical connector assembly comprising the electrical connector, an electronic package and a circuit substrate assembled to the electrical connector.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
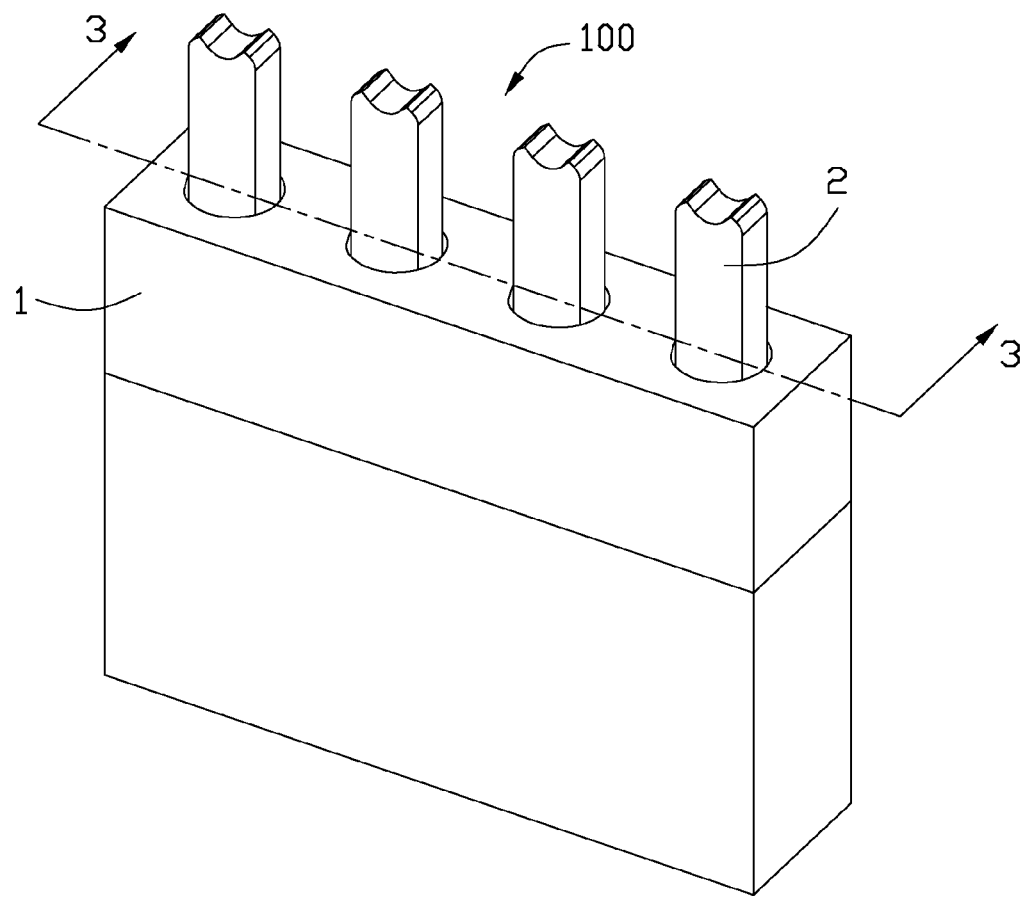
FIG. 1 is an assembled, perspective view of an electrical connector in accordance with a preferred embodiment of the present invention.
Figure 2:
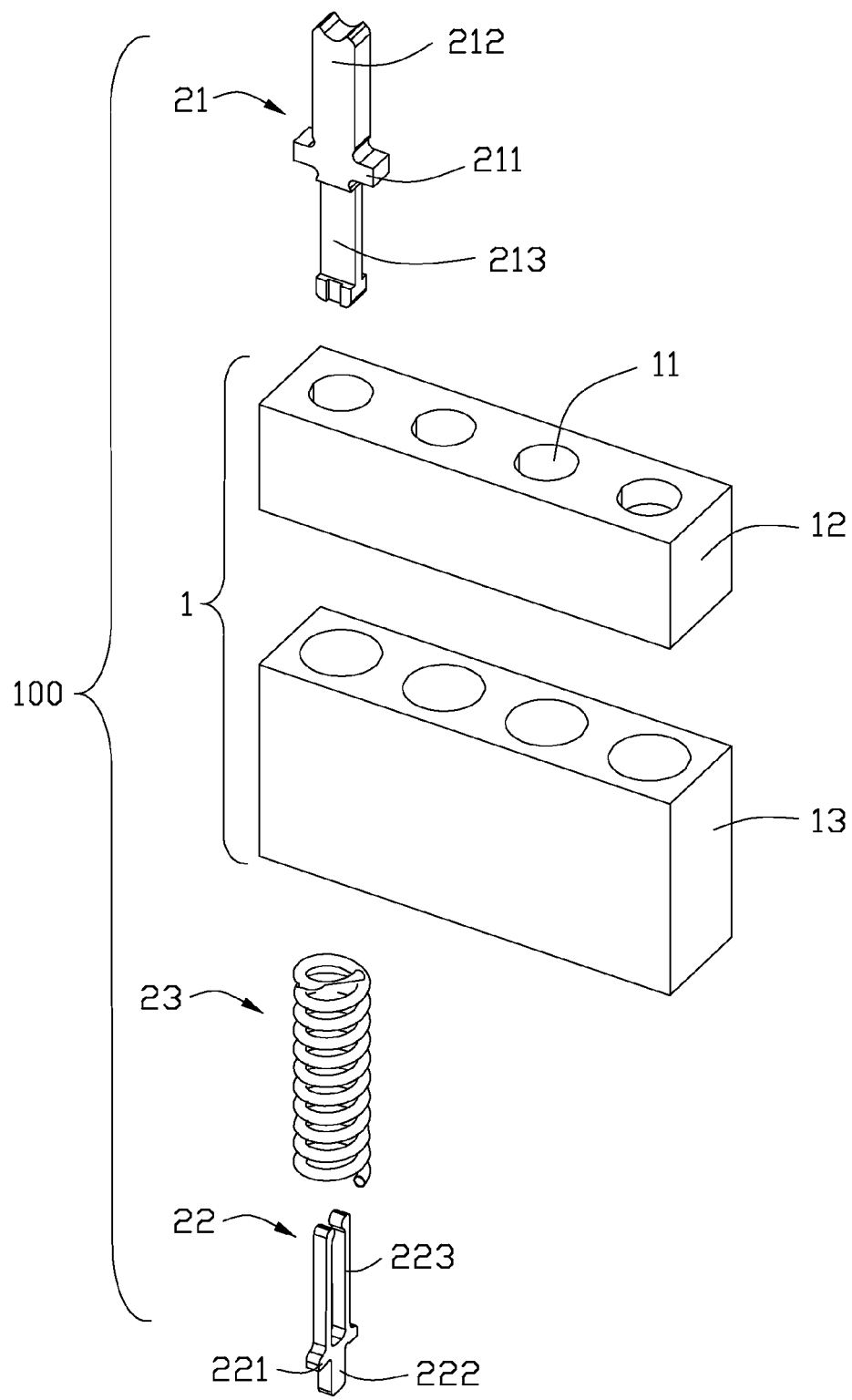
FIG. 2 is an exploded, perspective view of the electrical connector shown in FIG. 1.
Figure 3:
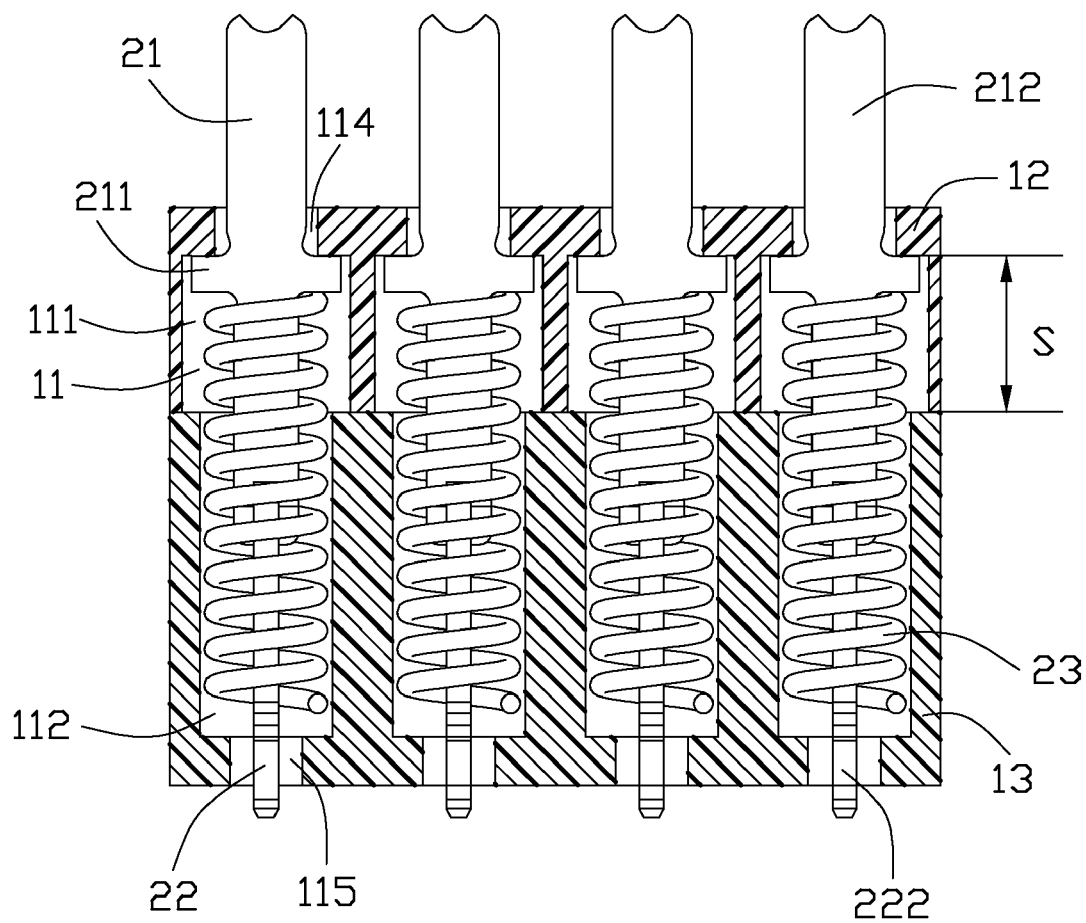
FIG. 3 is a cross sectional view taking along line 3-3 shown in FIG. 1.
Figure 4:
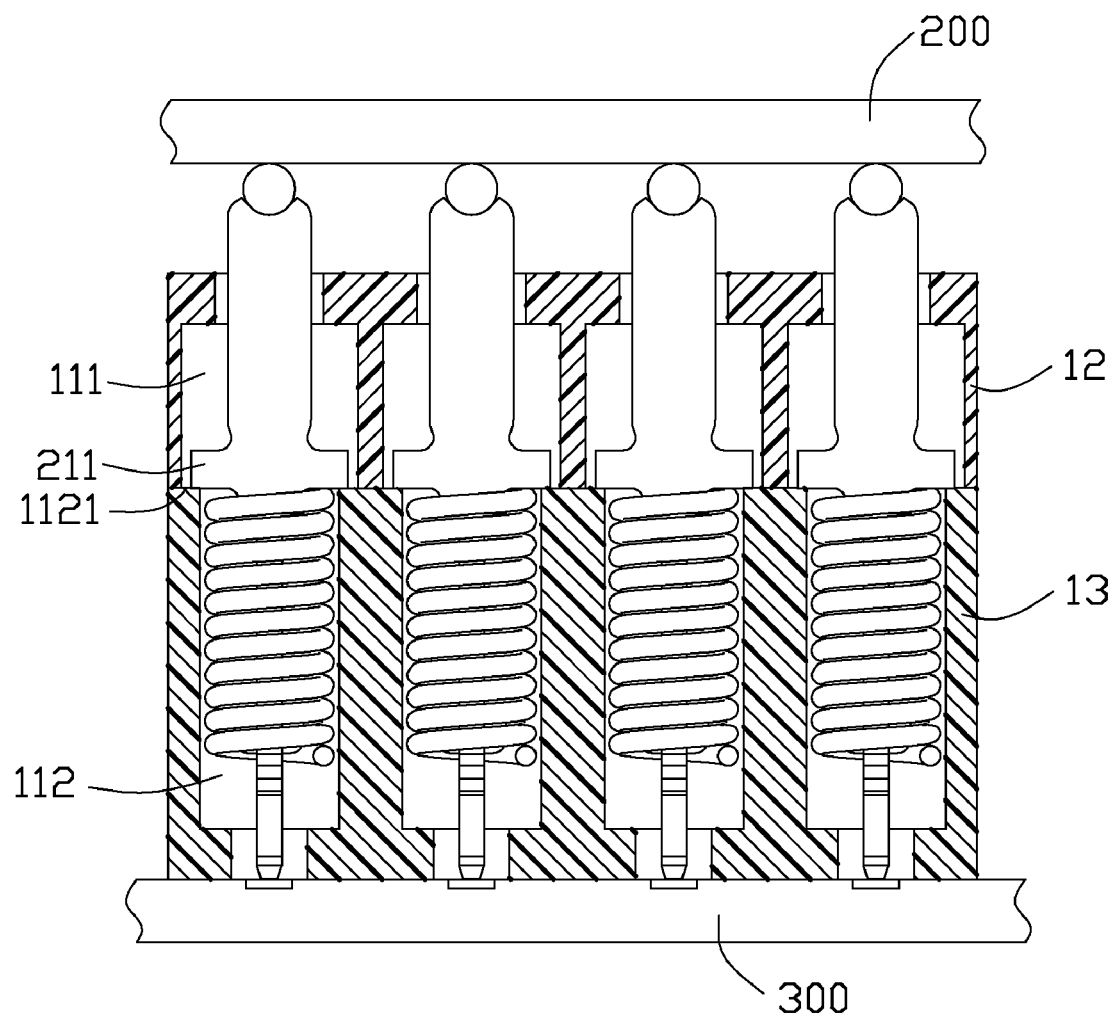
FIG. 4 is a cross sectional view of the electrical connector when electrically connects an electronic package with a circuit substrate.

Referring to FIGS. 1 to 4, an electrical connector 100 for electrically connecting an electronic package 200, such as a central processing unit (CPU), with a circuit substrate 300, such as a printed circuit board (PCB) comprises an insulative housing 1 and a plurality of electrical contacts 2 received in the insulative housing 2.

The insulative housing 1 includes an upper substrate 12 and a lower substrate 13 assembled with each other. The upper substrate 12 defines an array of upper holes 111 and the lower substrate 13 defines an array of lower holes 112 corresponding to the upper holes 111. A diameter of the lower hole 112 is less than that of the upper hole 111. The upper substrate 12 further defines upper openings 114 located on the upper holes 111 and the lower substrate 13 further defines lower openings 115 located below the lower holes 112. A diameter of the upper opening 114 is less than that of the upper hole 111 and a diameter of the lower opening 115 is less than that of the lower hole 112.

Each contact terminal 2 is configured by a lower contact 22 and an upper contact 21 moveably and electrically interlinked with each other, and a spring 23 enveloping both an overlapping portion of the upper and lower contacts 21, 22. The upper contact 21 has a restricting portion 211 protruding outwardly for restricting the spring 23, an upper contact portion 212 extending upwardly from the restricting portion 211 for electrically connecting with the electronic package 200, and an engaging portion 213 extending downwardly from the restricting portion 211 and electrically connecting to the lower contact 22. The restricting portion 211 is wider than the upper contact portion 212 and the engaging portion 213. A width of the restricting portion 211 is less than the diameter of the upper hole 111 and more than that of the lower hole 112.

The lower contact 22 has a supporting portion 221 protruding outwardly for supporting the spring 23, a lower contact portion 222 extending upwardly from the supporting portion 221 for electrically connecting with the circuit substrate 300, and a pair of engaging arms 223 extending from the supporting portion 221. The engaging arms 223 clamp and electrically connect to the engaging portion 211 of the upper contact 21.

The upper contact 21 is substantially received in the upper hole 111. The upper contact portion 212 extends out of the upper substrate 12 and an free end of the engaging portion 213 extends into the lower hole 112 for connecting with the lower contact 22. The lower contact 22 is substantially received in the lower hole 112. The lower contact portion 222 extends out of the lower opening 115 and the supporting portion 221 moves in the lower hole 112.

When the electronic package 200 and the circuit substrate 300 are assembled to the electrical connector 100, the terminal 2 is pressed by the electronic package 200 so that the upper contact 21 moves downwardly and the lower contact 22 moves upwardly. The spring 23 deforms elastically as a result of the relative movement of the upper and lower portions. The circuit substrate 300 abuts against the bottom surface of the lower substrate 13 and electrically connects to the lower contact 22. The lower contact portion 222 is received in the lower opening 115. The restricting portion 211 moves in the upper hole 111 and the maximum movement distance thereof is equal to a depth S of the upper hole 111 but less than the maximum deformation of the spring 23. A top surface 1121 of the lower hole 112 supports the restricting portion 211 thereby avoiding the movement distance of the upper contact 21 being greater than the maximum deformation of the spring 23 to protect the spring 23 from irreversible deformation.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector comprising:
    an insulative housing comprising an upper substrate and a lower substrate assembled with each other, the upper substrate defining an array of upper holes and an array of upper openings located on the upper holes, and the lower substrate defining an array of lower holes corresponding to the upper holes and an array of lower openings located below the lower holes; and
    a plurality of terminals received in the upper and lower holes and each comprising an upper contact, a lower contact electrically connecting with the upper contact and a spring arranged between the upper contact and the lower contact, the upper contact having a restricting portion to restrict the spring; wherein
    a dimension of the restricting portion is less than a width of the upper hole while is larger than that of the lower hole.

2. The electrical connector as claimed in claim 1, wherein the restricting portion moves in the upper holes and a maximum movement distance thereof is equal to a depth of the upper hole and less than a maximum deformation of the spring.

3. The electrical connector as claimed in claim 1, wherein the upper contact has an upper contact portion extending upwardly from the restricting portion and an engaging portion extending downwardly from the restricting portion and electrically connecting to the lower contact, and the restricting portion is wider than the upper contact portion and the engaging portion.

4. The electrical connector as claimed in claim 3, wherein the lower contact has a supporting portion supporting the spring, a lower contact portion extending downwardly from the supporting portion and a pair of engaging arms extending upwardly from the supporting portion, the engaging arms clamping and electrically connecting to the engaging portion of the upper contact.

5. The electrical connector as claimed in claim 4, wherein the upper contact portions extending out of the upper openings and the lower contact portions extending out of the lower openings.

6. An electrical connector assembly comprising:
    an electrical connector comprising an upper substrate with an array of upper holes, a lower substrate assembled to the upper substrate with an array of lower holes and a plurality of terminals received in the upper holes and the lower holes, each of the terminals having an upper contact with a restricting portion, a lower contact electrically connecting to the upper contact and a spring arranged between the upper and lower contact;
    an electronic package assembled to the electrical connector and pressing the upper contact; and
    a circuit substrate assembled to the electrical connector and electrically connecting to the lower contact; wherein
    a top surface of the lower substrate supports the restricting portion of the upper contact.

7. The electrical connector assembly as claimed in claim 6, wherein a diameter of the lower hole is less than that of the upper hole and a width of the restricting portion.

8. The electrical connector assembly as claimed in claim 6, wherein the restricting portion moves in the upper holes and a maximum movement distance thereof is equal to a depth of the upper hole and less than a maximum deformation of the spring.

9. The electrical connector assembly as claimed in claim 6, wherein the upper contact has an upper contact portion extending upwardly from the restricting portion and an engaging portion extending downwardly from the restricting portion and electrically connecting to the lower contact, and the restricting portion is wider than the upper contact portion and the engaging portion.

10. The electrical connector assembly as claimed in claim 9, wherein the lower contact has a supporting portion supporting the spring, a lower contact portion extending downwardly from the supporting portion and a pair of engaging arms extending upwardly from the supporting portion, the engaging arms clamping and electrically connecting to the engaging portion of the upper contact.

11. The electrical connector assembly as claimed in claim 10, wherein the upper substrate defines an array of upper openings located on the upper holes and the lower substrate defines an array of lower openings located below the lower holes, the upper contact portions extending out of the upper openings and electrically connecting to the electronic package, the lower contact portions received in the lower openings and electrically connecting to the circuit substrate.

12. An electrical connector assembly comprising:
    an upper housing and a lower housing assembled to each other and respectively defining at least one upper hole and a lower hole commonly forming a contact receiving passageway;
    an upper contact and a lower contact interengaged with each other and commonly received in said contact receiving passageway and urged to axially move away from each other by a spring under condition that the upper contact defines an upper contacting tip upwardly extending out of the upper housing and the lower contact defines a lower contacting tip downwardly extending out of the lower housing; wherein
    the upper contact defines an abutment section adapted to downwardly abut against the lower housing when the upper contact is downwardly pressed by an external electronic part to move downwardly with a specific distance so as to stop continuing downward movement of the upper contact and prevent excessive forces from being imposed upon the upper contact and the lower contact, and wherein said abutment section downwardly abuts the spring constantly.

13. The electrical connector assembly as claimed in claim 12, wherein said spring provides a maximum restoration force when the abutment section abuts against the lower housing.

14. The electrical connector assembly as claimed in claim 12, wherein the lower hole is smaller than the upper hole.

15. The electrical connector assembly as claimed in claim 12, wherein the abutment section abuts against the lower housing at an interface between the upper housing and the lower housing.

16. The electrical connector assembly as clamed in claim 12, wherein the upper contact and the lower contact are intersected with each other in a cross-sectional view.

* * * * *